United States Patent [19]

Mitchell et al.

[11] 4,375,578
[45] Mar. 1, 1983

[54] SEMICONDUCTOR DEVICE AND METHOD OF MAKING THE SAME

[75] Inventors: Gordon C. Mitchell, Pomona; Barney Horwitz, Placentia, both of Calif.

[73] Assignee: General Dynamics, Pomona Division, Pomona, Calif.

[21] Appl. No.: 232,344

[22] Filed: Feb. 6, 1981

[51] Int. Cl.³ .............................................. H05K 5/06
[52] U.S. Cl. ................................... 174/52 H; 357/84
[58] Field of Search ............... 174/52 H, 52 S, 35 TS; 357/74, 84

[56] References Cited

U.S. PATENT DOCUMENTS

| | | |
|---|---|---|
| 2,712,619 | 7/1955 | Zetwo . |
| 2,825,014 | 2/1958 | Willemse . |
| 2,857,560 | 10/1958 | Schnable et al. . |
| 2,896,136 | 7/1959 | Hales . |
| 2,960,641 | 11/1960 | Cohen et al. . |
| 2,981,876 | 4/1961 | Willemse . |
| 3,073,070 | 5/1962 | Sussman et al. . |
| 3,211,827 | 10/1965 | Trueb et al. ...................... 174/52 H |
| 3,267,341 | 8/1966 | Evander . |
| 3,487,275 | 12/1969 | Perrin et al. . |
| 3,713,007 | 1/1973 | Walter . |

FOREIGN PATENT DOCUMENTS

| | | |
|---|---|---|
| 1304469 | 8/1962 | France . |
| 2058506 | 4/1981 | United Kingdom .................. 357/74 |

*Primary Examiner*—A. T. Grimley
*Assistant Examiner*—D. A. Tone
*Attorney, Agent, or Firm*—Neil F. Martin; Earl F. Kotts; Edward B. Johnson

[57] ABSTRACT

A sealing liner of flexible material such as Teflon has a downwardly tapering side wall which is positioned over a header. A case is positioned over the liner, and the top of the case is moved into engagement with the top of the liner to capture the tapered side wall of the liner between the side walls of the header and the case to provide a tight cold flow seal so that small particles working loose from the case cannot reach the header.

7 Claims, 3 Drawing Figures

U.S. Patent        Mar. 1, 1983        4,375,578
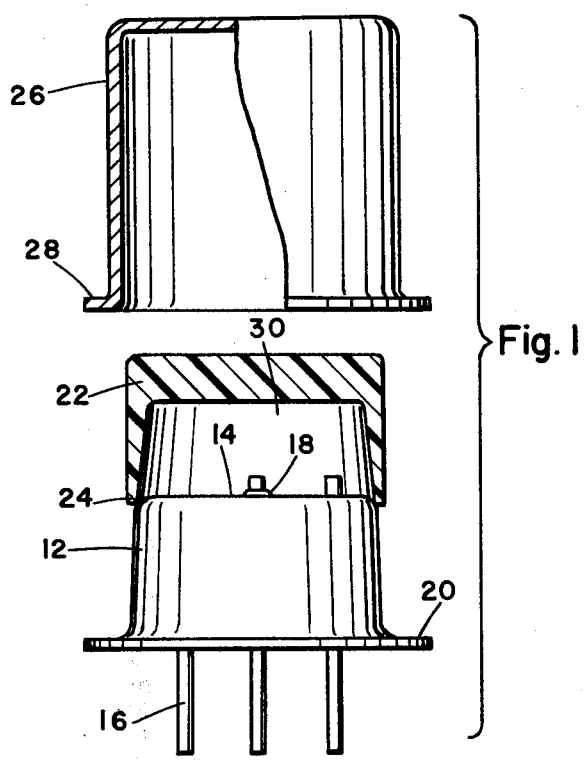
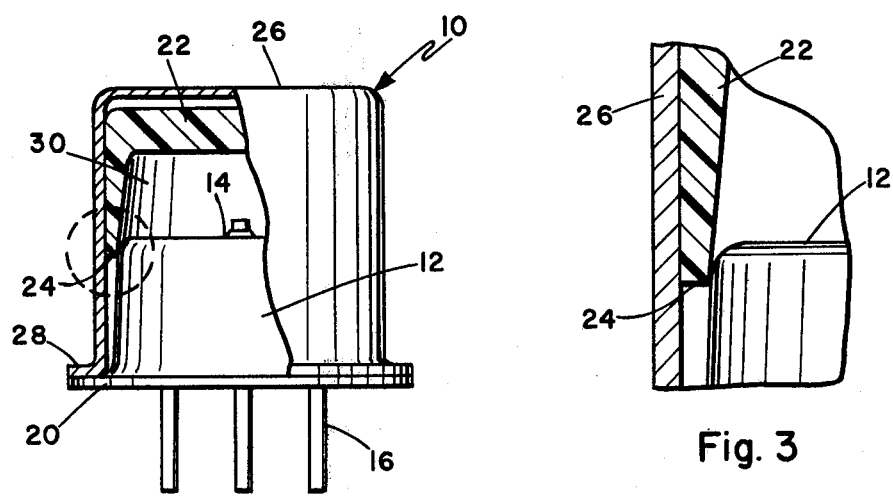
Fig. 1
Fig. 2
Fig. 3

SEMICONDUCTOR DEVICE AND METHOD OF MAKING THE SAME

The U.S. Government has rights in this invention pursuant to Contract Number N00017-74-C-2259, awarded by the U.S. Navy.

BACKGROUND OF THE INVENTION

The invention relates to semiconductor devices such as transistors and the method of making the same.

Semiconductors such as transistors are normally manufactured with the active semiconductor elements contained on a header of metallic material and with the electrodes protruding from the header thru insulators. A metal case produced by a stamping operation is positioned over the header to protect the header and active elements of the semiconductor from damage. When the metal case is formed by the stamping operation, minute particles of metal cling to the finished stamping despite extreme care and costly efforts to move and/or detect the particles. Among the measures taken, the stamped metal case is thoroughly cleaned and the case and transistor are thoroughly inspected.

The particles from the case are so small that they cannot be detected by normal methods. They are on the order of one to two one-hundredths of a microgram in mass and are very thin. A particle 0.001 inch to 0.002 inch in diameter would be considered a very large particle. The shape of the particle prevents it from concentrating with others in one position. The particle is so small that it makes no noise if the transistor is shaken and the particle is bounced against the case.

Attempts have been made to screen out transistors with these undesired particles but such methods as acoustical detection under vibration have been unsuccessful. The small metal particles or flakes which cling to the metal case remain attached to the case until the right condition arises during handling when a particular type of shock or a particular vibration will cause the particles to detach from the case with the result that they short the active elements on the semiconductor chip which is positioned atop the transistor header. This causes failure of the transistor in the system which it is controlling with an accompanying loss of time and expense while a technican trouble shoots the system. This has been a significant and costly problem. A solution to this problem has been sought which would provide a highly effective seal while maintaining commercial practicality.

SUMMARY OF THE INVENTION

An exemplary embodiment of the invention overcomes the deficiencies of the prior art by providing a new and improved method of sealing a semiconductor device which is simple in construction and relatively inexpensive to manufacture.

The invention includes liner means of flexible, inert material, which will cold flow, such as Teflon (polytetrafluoroethylene). The side wall of the liner means is tapered downwardly and the liner means is positioned over a header means. Case means is placed over the liner means, and the top of the case means is moved against the top of the liner means for capturing the tapered side wall of the liner means between the side walls of the header means and the case means. The liner means forms a tight, effective seal between the header means and the case means.

DESCRIPTION OF THE DRAWINGS

FIG. 1 is an exploded elevation partly in section of a transistor assembly, showing the liner positioned on the header and the case disposed above the liner before it is moved downward on top of the liner.

FIG. 2 is an elevation partly in section of the completed transistor assembly.

FIG. 3 is an enlarged fragmentary view taken within the dotted line in FIG. 2 and demonstrating the seal formed between the header and the case by the liner.

DETAILED DESCRIPTION OF A PREFERRED EMBODIMENT

Referring to the drawings, a transistor assembly is indicated by the number 10. The transistor includes a cup-shaped header 12 formed of an insulating material such as glass with a semiconductor element 14 positioned on top and with electrodes 16 welded to the semiconductor at 18 and extending downward below the header for attachment to a circuit in usual fashion. The header 12 includes a bottom flange 20. A substantially thimble-shaped liner of flexible electrical insulating material which will cold flow under pressure is shown at 22. Teflon has proven to be an acceptable material. The side wall of the liner is tapered downwardly and the lip 24 formed by the bottom of the liner engages the header 12 as shown in FIG. 1 of the drawings.

A stamped metal case is indicated at 26 in the drawings. The case includes a bottom flange 28 which is adapted to seat on the bottom flange 20 of header 12 in the assembled position. The case is moved downward from its position in FIG. 1 and the top of the case engages the top of the liner 22 to move the liner down on the header 12. The bottom flange 28 of the case 26 then engages the bottom flange 20 of the header 12 as shown in FIG. 2 of the drawings. The dimensions of the parts are closely controlled so that when the flanges engage, the liner 22 will have been moved down the proper distance on the header 12 and an effective seal will be formed between the header and the case as shown in FIG. 3 of the drawings without collapsing liner 22. Thus, a chamber 30 is provided by the liner. The Teflon material of the liner cold flows to seal irregularities existing in the outer wall of header 12 and the inner wall of case 26. This seal prevents the tiny metal particles from the case stamping from reaching the active elements and electrode connections on the header 12.

The components involved are very small. For example, a typical transistor case is 0.195 inch in diameter and 0.210 inch in height. Thus, in addition to forming an unusually effective seal, the sealing arrangement must be simple in construction.

While the present invention has been illustrated and described by means of a particular embodiment, it is to be understood that numerous changes and modification may be made therein without departing from the spirit and scope of the invention as defined in the appended claims.

Having described our invention, we claim:

1. A semiconductor device comprising:
   a substantially cup-shaped header means of electrical insulating material having semiconductor means atop thereof and having flange means at the bottom thereof;
   a substantially cup-shaped case means for positioning over said header means with a space between the side wall of said case means and said header means and having flange means at the bottom thereof for connection to the flange means on said header means; and a substantially thimble-shaped liner means of flexible, electrical insulating material for positioning between said header means and said case means, said liner means including a side wall that tapers toward the bottom and forming lip means for positioning between the side wall of said liner means and the side wall of said case means in pressure engagement with said side walls, said liner means comprising means for providing a tight seal and preventing small particles which work loose from said case means from engaging the semiconductor means atop said header means.

2. A semiconductor device according to claim 1 wherein said liner means is made of a material which is characterized by exhibiting cold flow under pressure.

3. A semiconductor device according to claim 2 wherein said liner material is polytetrafluoroethylene.

4. A semiconductor device according to claim 1 wherein the top of said case means is positioned for engaging the top of said liner means and holding said lip means in sealing engagement.

5. A semiconductor device according to claim 1 or 2 wherein the top of said line means is positioned for spacing above the top of said header means and providing a chamber.

6. The method of sealing a semiconductor means in a semiconductor assembly comprising the steps of:

positioning a substantially thimble-shaped flexible liner means of cold-flowable material having a tapered side wall over a substantially cup-shaped header means having a semiconductor means atop thereof and flange means at the bottom thereof;

positioning a substantially cup-shaped case means having flange means at the bottom thereof over said liner means and moving the top of said case means against the top of said liner means until the flange means on said case means engages the flange means on said header means for capturing the tapered side wall of said liner means between said header means and said case means in tight sealing engagement and forming a chamber over said header means; and joining said case flange means to said header flange means.

7. The method of sealing a semiconductor assembly according to claim 6 wherein the length of said liner means, the distance between the top inside of the case means and its flange means, and the distance between the top outside of said header means and its associated flange means are carefully controlled so that when said case flange means engages said header flange means a predetermined pressure is created on said liner means for forming a seal without collapsing said liner means.

* * * * *